(12) United States Patent
Hatano et al.

(10) Patent No.: US 11,604,235 B2
(45) Date of Patent: Mar. 14, 2023

(54) MAGNETIC MEASURING DEVICE

(71) Applicants: TOKYO INSTITUTE OF TECHNOLOGY, Tokyo (JP); OSAKA UNIVERSITY, Osaka (JP)

(72) Inventors: Mutsuko Hatano, Tokyo (JP); Takayuki Iwasaki, Tokyo (JP); Yoshie Harada, Osaka (JP); Yuji Hatano, Osaka (JP)

(73) Assignees: TOKYO INSTITUTE OF TECHNOLOGY, Tokyo (JP); OSAKA UNIVERSITY, Osaka (JP)

( * ) Notice: Subject to any disclaimer, the term of this patent is extended or adjusted under 35 U.S.C. 154(b) by 255 days.

(21) Appl. No.: 17/274,604

(22) PCT Filed: Oct. 15, 2019

(86) PCT No.: PCT/JP2019/040499
§ 371 (c)(1),
(2) Date: Mar. 9, 2021

(87) PCT Pub. No.: WO2020/080362
PCT Pub. Date: Apr. 23, 2020

(65) Prior Publication Data
US 2022/0050153 A1  Feb. 17, 2022

(30) Foreign Application Priority Data

Oct. 16, 2018  (JP) .............................. JP2018-195324

(51) Int. Cl.
*G01R 33/24* (2006.01)
*G01N 21/64* (2006.01)

(52) U.S. Cl.
CPC ......... *G01R 33/24* (2013.01); *G01N 21/6408* (2013.01); *G01N 2021/6463* (2013.01)

(58) Field of Classification Search
CPC ....... G01N 2021/6463; G01N 21/6408; G01N 21/6456; G01N 24/10; G01R 33/24;
(Continued)

(56) References Cited

U.S. PATENT DOCUMENTS 10,921,394 B2 * 2/2021 Roy-Guay ......... G01R 33/0206
2016/0174867 A1 * 6/2016 Hatano .................. G01R 33/60
600/409

(Continued)

OTHER PUBLICATIONS

Davis et al., "Mapping the microscale origins of magnetic resonance image contrast with subcellular diamond magnetometry", Nature Communications (2018) 9:131.
(Continued)

*Primary Examiner* — Jay Patidar
(74) *Attorney, Agent, or Firm* — Myers Wolin, LLC

(57) ABSTRACT

A magnetic measuring device includes: a determination part configured to identify four maximum inclination points in an average value in a visual field of a light detection magnetic resonance spectrum and configured to determined a degree of decrease in relative fluorescence intensity and a microwave frequency at each of the maximum inclination points; a setting part configured to set a reference decrease degree of the relative fluorescence intensity in a predetermined area and configured to set operating point frequency initial values at four points at which the reference decrease degree is achieved, near the microwave frequencies at the respective maximum inclination points; a frequency update part configured to update operating point frequencies at the four points; and a frequency correction part configured to input the updated operating point frequencies to a microwave oscillator as corrected operating point frequencies.

19 Claims, 13 Drawing Sheets

(58) Field of Classification Search
CPC ...... G01R 33/02; G01R 33/26; G01R 33/323; G01R 33/60
See application file for complete search history.

(56) References Cited

U.S. PATENT DOCUMENTS

2016/0216341 A1* 7/2016 Boesch ................ G01R 33/032
2017/0343412 A1* 11/2017 Bruce ................... G01J 1/0425

OTHER PUBLICATIONS

International Search Report and Written Opinion of the International Searching Authority issued by the Japan Patent Office for corresponding International Patent Application No. PCT/JP2019/040499, dated Dec. 17, 2019, with partial English translation.

* cited by examiner

MAGNETIC MEASURING DEVICE

CROSS-REFERENCE TO RELATED APPLICATION

This application is a national stage application of International Application No. PCT/JP2019/040499, filed on Oct. 15, 2019 and designated the U.S., which claims priority to Japanese Patent Application No. 2018-195324, filed on Oct. 16, 2018. The contents of each are herein incorporated by reference.

FIELD

The present disclosure relates to a magnetic measuring device.

BACKGROUND

A nitrogen-vacancy center (NV center) in a diamond crystal has a nanoscale structure, and emits high-brightness fluorescence that does not fade. The fluorescence due to optical microwave resonance is easily distinguishable from autofluorescence. Since the diamond has absolute biocompatibility, research has been widely advanced for application to biological imaging.

In particular, a technique, taking advantage of the fact that fluorescence in the NV center of the diamond changes sensitively with respect to magnetism, is attracting attention in which a high-density NV center layer is formed in a high-quality diamond plate, and a two-dimensional magnetic distribution on a surface of the diamond plate is measured as an image, thereby measuring biomagnetism. A process of incorporating superparamagnetic particles having a diameter of 200 nm into an intracellular tissue is measured for 10 hours.

It is the greatest feature of magnetic measurement by diamond plates that high-resolution measurement on the order of 200 nm is possible over a long period of time of 10 hours. This is because excitation light with which the diamond plate is to be irradiated to obtain fluorescence from the diamond plate has only to be essentially applied only to the diamond plate, and does not necessarily irradiate the cell itself, thereby enabling avoidance of light damage.

CITATION LIST

Non Patent Literature

[NPL 1] Hunter C. Davis, Pradeep Ramesh, Aadyot Bhatnagar, Audrey Lee-Gosselin, John F. Barry, David R. Glenn, Ronald L. Walsworth & Mikhail G. Shapiro, "Mapping the microscale origins of magnetic resonance image contrast with subcellular diamond magnetometry." NATURE COMMUNICATIONS (2018) 9:131

SUMMARY

Technical Problem

The method of Davis uses, for magnetic field detection, a sharp peak position at a hyperfine level in an optical microwave resonance spectrum of an NV center in a diamond plate. Here, in order to sharpen a peak at the hyperfine level, a high-purity crystal is used for the diamond plate, and an isotope control is used for forming an NV center layer to remove $^{13}C$ atoms.

However, high-purity diamond plate crystals require an enormous amount of dates and hours for the growth. Also, the isotope control requires special source gas subjected to isotope purification.

On the other hand, when a diamond plate having a high growth rate and easy to manufacture is used, it is inevitable that a certain amount of impurity is mixed into the plate. In addition, when an inexpensive source gas not subjected to the isotope purification is used, it is inevitable that $^{13}C$ atoms are mixed by about 1% with respect to $^{12}C$ atoms. This causes the following problems.

It is not possible to confirm a hyperfine level sharply.

Non-uniformity in NV density in an NV layer and coherence time of electron spin is generated.

The present disclosure has been made in view of the above circumstances, and an object of the present disclosure is to provide a magnetic measuring device capable of measuring magnetism with high sensitivity even if a diamond plate is not highly pure and density and electron spin coherence time of an NV center are nonuniform.

Solution to Problem

In order to achieve the object, a magnetic measuring device according to one aspect of the present disclosure includes: a diamond plate including an NV center in a predetermined area; a static magnetic field application part for applying a static magnetic field to one or more magnetic particles that are formed in an aggregate of a plurality of superparamagnetic particles that are placed on the diamond plate and exhibit superparamagnetic properties, and the diamond plate; a microwave irradiation part for irradiating the diamond plate with a microwave; a light source part for irradiating the diamond plate with excitation light; an image sensor for detecting intensity of fluorescence in the predetermined area of the diamond plate by the excitation light for each pixel arrayed two-dimensionally; a determination part for identifying, based on a detection result of the image sensor, two positive and negative maximum inclination points from each of two relative fluorescence intensity decrease points in a pair which are generated to be symmetrical about near 2870 MHz in an average value in a visual field of an optically detected microwave resonance spectrum of the diamond plate after Zeeman splitting by the static magnetic field when an optical microwave resonance spectrum has microwave frequency dependence of relative fluorescence intensity which is a ratio of a difference in fluorescence intensity between when no microwave is irradiated and when the microwave is irradiated with respect to the fluorescence intensity when no microwave is irradiated, and determining a degree of decrease in the relative fluorescence intensity and a microwave frequency at each of maximum inclination points of the respective identified four points in total; a setting part for setting a reference decrease degree of the relative fluorescence intensity in the predetermined area and setting operating point frequency initial values at the four points at which the reference decrease degree is achieved, near the microwave frequencies at the respective maximum inclination points, based on the determined relative fluorescence intensity and the microwave frequency determined for each maximum inclination point by the determination part; a frequency update part for updating operating frequencies at the four points so that the degree of decrease in the relative fluorescence intensity in the predetermined area in the operating point frequency at each of the four points approaches the reference decrease degree; a frequency correction part for inputting the updated operating point frequencies as corrected operating point frequencies to a microwave oscillator; an integration part for integrating the detection result of the image sensor at each of the corrected operating point frequencies for each pixel while the microwave irradiation part sequentially irradiates the predetermined area within a predetermined period of time with each of the microwaves having the operating point frequencies at the four points; and an output part for outputting the relative fluorescence intensity in the predetermined area as an image based on a result integrated for each pixel by the integration part.

In addition, a magnetic measuring device according to one aspect of the present disclosure includes: a diamond plate including an NV center in a predetermined area; a static magnetic field application part for applying a static magnetic field to the diamond plate; a microwave irradiation part for irradiating the diamond plate with a microwave; a light source part for irradiating the diamond plate with excitation light; and fluorescence detection means for detecting intensity of fluorescence in the predetermined area of the diamond plate by the excitation light, wherein when a ratio of a fluorescence intensity difference between when the microwave is irradiated and when no microwave is irradiated or when the microwave having a frequency having no influence on the fluorescence intensity with respect to the fluorescence intensity when no microwave is irradiated or when the microwave having a frequency having no influence on the fluorescence intensity is referred to as relative fluorescence intensity, two relative fluorescence intensity decrease areas in a pair are selected, the relative fluorescence intensity decrease areas being generated to be symmetrical about near 2870 MHz of the microwave frequency by the static magnetic field, when each of the decrease areas is further divided into a lower frequency side and a higher frequency side than a minimum value of the decrease area, in four frequency regions in total on the lower frequency side and the higher frequency side of a first relative fluorescence intensity decrease area, and on the lower frequency side and the higher frequency side of a second relative fluorescence intensity decrease area, a change in the relative fluorescence intensity is considerably larger than a change in the frequency and a reference decrease degree of the relative fluorescence intensity commonly included in the four frequency regions is set, while sequentially and cyclically irradiating the four frequency regions with four microwave frequencies in total, respectively, the relative fluorescence intensity at each frequency is detected by the fluorescence detection part, whereby an integration result of the relative fluorescence intensity at each microwave frequency and a difference in the reference decrease degree are reflected, and the microwave frequency is adjusted in each frequency region, whereby the relative fluorescence intensity is set as a linear operation value among the four microwave frequencies converged to the reference decrease degree, and a magnetic field or a temperature in the predetermined area of the diamond plate is measured, whereby a noise of a longer cycle than the cycle is eliminated.

In addition, in the magnetic measuring device according to one aspect of the present disclosure, the image sensor performs exposure and reading for each of a period of time during which the microwave irradiation part irradiates the predetermined area with the microwave having any one of the four operating point frequencies and a period of time during which the microwave irradiation part does not irradiate the predetermined area.

In the magnetic measuring device according to one aspect of the present disclosure, the microwave irradiation part includes: a microwave generation part for generating a microwave; a phase shifter for setting a phase delay of the microwave generated by the microwave generation part; and a microwave coil for irradiating the diamond plate with a microwave in which a phase delay is set by the phase shifter.

In addition, in the magnetic measuring device according to one aspect of the present disclosure, the microwave coil generates a microwave magnetic field in a direction parallel to a surface of the diamond plate.

In addition, in the magnetic measuring device according to one aspect of the present disclosure, a thickness of an NV layer, which is a thin film including the NV center, of the diamond plate is substantially equal to a diameter of a magnetic particle.

In addition, the magnetic measuring device according to one aspect of the present disclosure includes a storage part for storing each of results integrated by the integration part at a predetermined time interval for each pixel, wherein the output part corrects, based on the results stored in the storage part, a distribution for each pixel of the relative fluorescence intensity in the predetermined area every time interval according to a minimum value of a decrease point of the relative fluorescence intensity measured for each pixel in advance, and outputs as an image.

Advantageous Effects of Invention

The present disclosure has an effect capable of measuring magnetism with high sensitivity even if a diamond plate is not highly pure and density and electron spin coherence time of an NV center are nonuniform.

BRIEF DESCRIPTION OF DRAWINGS

FIG. 5(*b*) is a timing chart showing a signal switching timing when the microwave frequency is fB in FIG. 5(*a*).

FIG. 8(*b*) shows a photograph showing a magnetic image integrated for a relatively short period of time in the visual view. FIG. 8(*c*) is a photograph showing a magnetic image integrated for a relatively long period of time in the visual field.

DESCRIPTION OF EMBODIMENTS

Hereinafter, an embodiment of a magnetic measuring device 1 will be described in detail with reference to the drawings.

Figure 1:
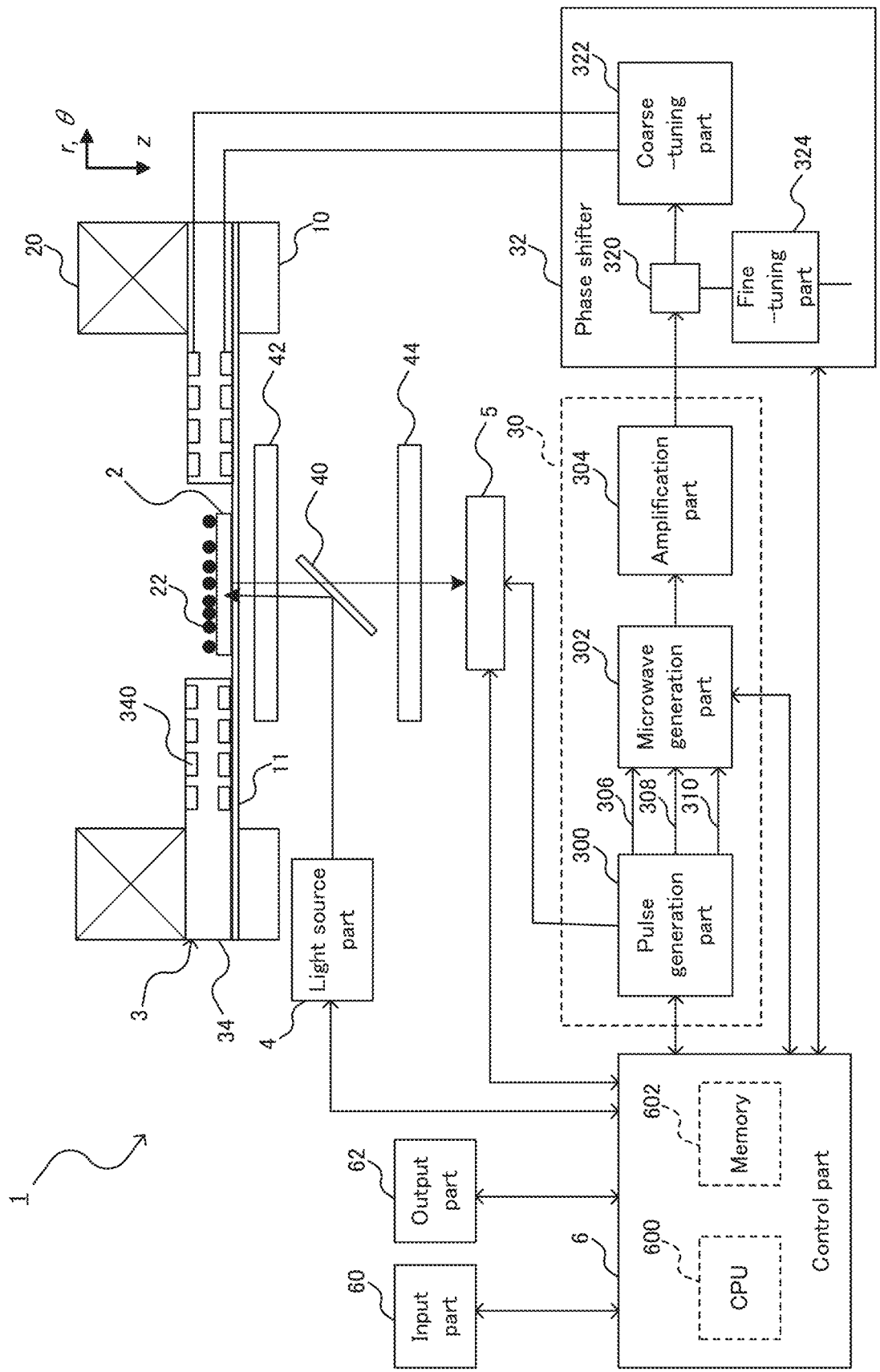
FIG. 1 is a diagram schematically illustrating an example of a configuration of a magnetic measuring device according to an embodiment.

FIG. 1 is a diagram schematically illustrating an example of a configuration of the magnetic measuring device 1 according to an embodiment. As illustrated in FIG. 1, the magnetic measuring device 1 includes a diamond plate 2, a static magnetic field application part 20, a microwave irradiation part 3, a light source part 4, an image sensor 5, a control part 6, an input part 60, and an output part 62. The magnetic measuring device 1 is a solid quantum sensor system capable of measuring a target magnetic field with high sensitivity and outputting a change of the magnetic field by an image or the like.

The diamond plate 2 is a so-called diamond sensor provided, on its surface, with an NV layer including a nitrogen-vacancy center (NV center) in a predetermined area which is a visual field, and is arranged on a microscope stage 10 which allows light pass therethrough. A cover glass 11 which allows light to pass therethrough is placed between the microscope stage 10 and the diamond plate 2. Here, a z-axis is taken in a direction perpendicular to the surface of the diamond plate 2. It is known that, in the diamond plate 2 of the plane (111), NV axes are aligned 100% unidirectionally (in a direction perpendicular to the plane (111)).

The static magnetic field application part 20 applies a static magnetic field to one or more magnetic particles 22 placed on the diamond plate 2 and the diamond plate 2. The magnetic particle 22 is a spherical particle having a diameter of, for example, about 1 μm, in which a plurality of superparamagnetic particles 220 (see FIG. 13) exhibiting superparamagnetic properties are coated with a polymer 222 to be formed in an aggregate. The superparamagnetic particle 220 is a fine iron oxide ($Fe_2O_3$) particle having a diameter of, for example, about 5 nm. The superparamagnetic properties appear in nano fine particles made of ferromagnetic material or ferrimagnetic material and having diameters of, for example, 50 nm or less. In other words, the magnetic particle 22 is magnetized by the static magnetic field applied by the static magnetic field application part 20.

In addition, the thickness of the diamond plate 2 is set to be equal to or less than an effective working distance of an objective lens 42, which will be described later, while reflecting the refractive index of the diamond. Thus, the diamond plate 2 can measure the magnetism of the magnetic particles 22 placed on the surface from the back surface.

The microwave irradiation part 3 includes a microwave oscillator 30, a phase shifter 32, and a microwave coil board 34. The microwave oscillator 30 includes a pulse generation part 300, a microwave generation part 302, and an amplification part 304. The pulse generation part 300 outputs a pulse modulation signal 306, a frequency update signal 308, and a sweep start signal 310 to the microwave generation part 302, and outputs an exposure signal to the image sensor 5, according to the control of the control part 6. The microwave generation part 302 generates a microwave having a frequency indicated in a frequency list, which will be described later, according to the control of the control part 6. The amplification part 304 amplifies the microwave generated by the microwave generation part 302 and outputs the amplified microwave to the phase shifter 32.

The phase shifter 32 includes a branch point 320, a coarse-tuning part 322, and a fine-tuning part 324, and sets and adjusts a phase delay of the microwave generated by the microwave oscillator 30. The coarse-tuning part 322 coarsely adjusts the phase of the microwave received via the branch point 320. The fine-tuning part 324 finely adjusts the phase of the microwave received via the branch point 320.

Then, the phase shifter 32 adjusts the phase of the microwave to align the depths of two "valleys" in a pair in an optically detected microwave resonance spectrum, which will be described later. The depths of two "valleys" are generally different from each other.

Specifically, the phase shifter 32 brings an "antinode" of a voltage standing wave to the branch point 320, to thereby adjust the phase shift amount in the coarse-tuning part 322 so that the fine-tuning part 324 functions effectively. In addition, when the changes in the positional relationships of the static magnetic field application part 20, the microwave coil 340 and the objective lens 42 with respect to the diamond plate 2 are small, for example, when the focal point of the objective lens 42 only moves to a different position in the diamond plate 2, only the adjustment by the fine-tuning part 324 may be performed.

Figure 2:
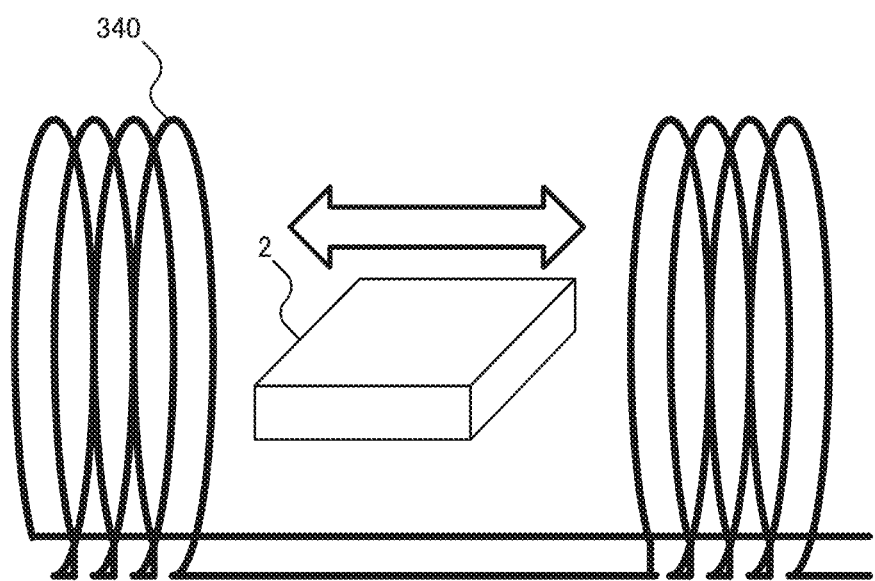
FIG. 2 is a diagram schematically illustrating a relationship between a structure of a microwave coil and a diamond plate.

The microwave coil board 34 is, for example, a multi-layer printed circuit board, and includes a microwave coil 340 formed of multi-layer wiring, and irradiates the diamond plate 2 with the microwave whose phase is adjusted by the phase shifter 32. FIG. 2 is a diagram schematically illustrating a relationship between a structure of the microwave coil 340 for (111) and the diamond plate 2. As illustrated in FIG. 2, the microwave coil 340 efficiently generates a microwave magnetic field in a direction parallel to the surface of the diamond plate 2. As described above, when the microwave magnetic field is orthogonal to the NV axis of the diamond plate 2, it is possible to maximize the detection efficiency of the magnetic field change.

The light source part 4 is, for example, a laser light source or an LED light source, outputs green light having a wavelength of 533 nm as excitation light, and excites the NV center included in the predetermined area of the diamond plate 2 via a dichroic mirror 40 and the objective lens 42. The objective lens 42 is focused on the surface of diamond plate 2. The excitation light output from the light source part 4 is a continuous wave (CW; steady output), and is not modulated. Furthermore, the excitation light output from the light source part 4 illuminates the entire visual field of the diamond plate 2 by Koehler illumination.

Here, the light source part 4 may irradiate only the diamond plate 2 with the excitation light, and may prevent the magnetic particles 22 or the like placed on the diamond plate 2 from being irradiated with the excitation light. For example, the light source part 4 is set so that the excitation light is substantially reflected by the diamond plate 2 by adjusting an irradiation angle of the excitation light with respect to the diamond plate 2.

Then, the diamond plate 2 excited by the excitation light emits red fluorescence. The fluorescence emitted from the diamond plate 2 is captured by the image sensor 5 as an image of the visual field via the objective lens 42, the dichroic mirror 40, the condenser lens 44, and the like.

The image sensor 5 is, for example, a CMOS area sensor, and detects the intensity of the fluorescence in the visual field of the diamond plate 2 excited by the excitation light for each of pixels arrayed two-dimensionally.

The control part 6 includes a CPU 600 and a memory (storage part) 602. The control part 6 controls each part constituting the magnetic measuring device 1, and performs calculation such as integration, which will be described later as an integration part, and image processing. The input part 60 receives an operation input of an operator to the magnetic measuring device 1 and outputs the input to the control part 6. The output part 62 is, for example, a display, a printer, or the like, and outputs information on magnetism measured by the magnetic measuring device 1, and the like, by an image or the like.

Figure 3:
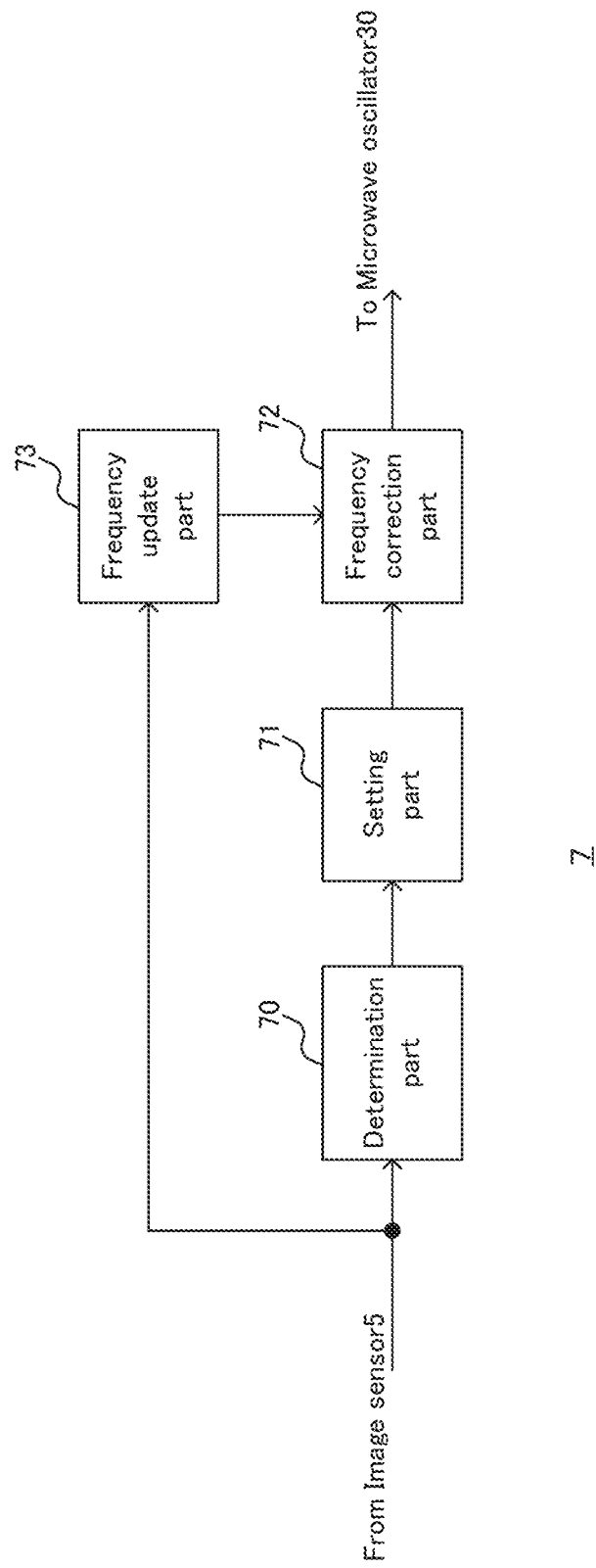
FIG. 3 is a diagram illustrating an example of a function of a program to be executed by a CPU.

FIG. 3 is a diagram illustrating an example of a function of a program 7 to be executed by the CPU 600. The program 7 includes, for example, a determination part 70, a setting part 71, a frequency correction part 72, and a frequency update part 73.

Figure 4:
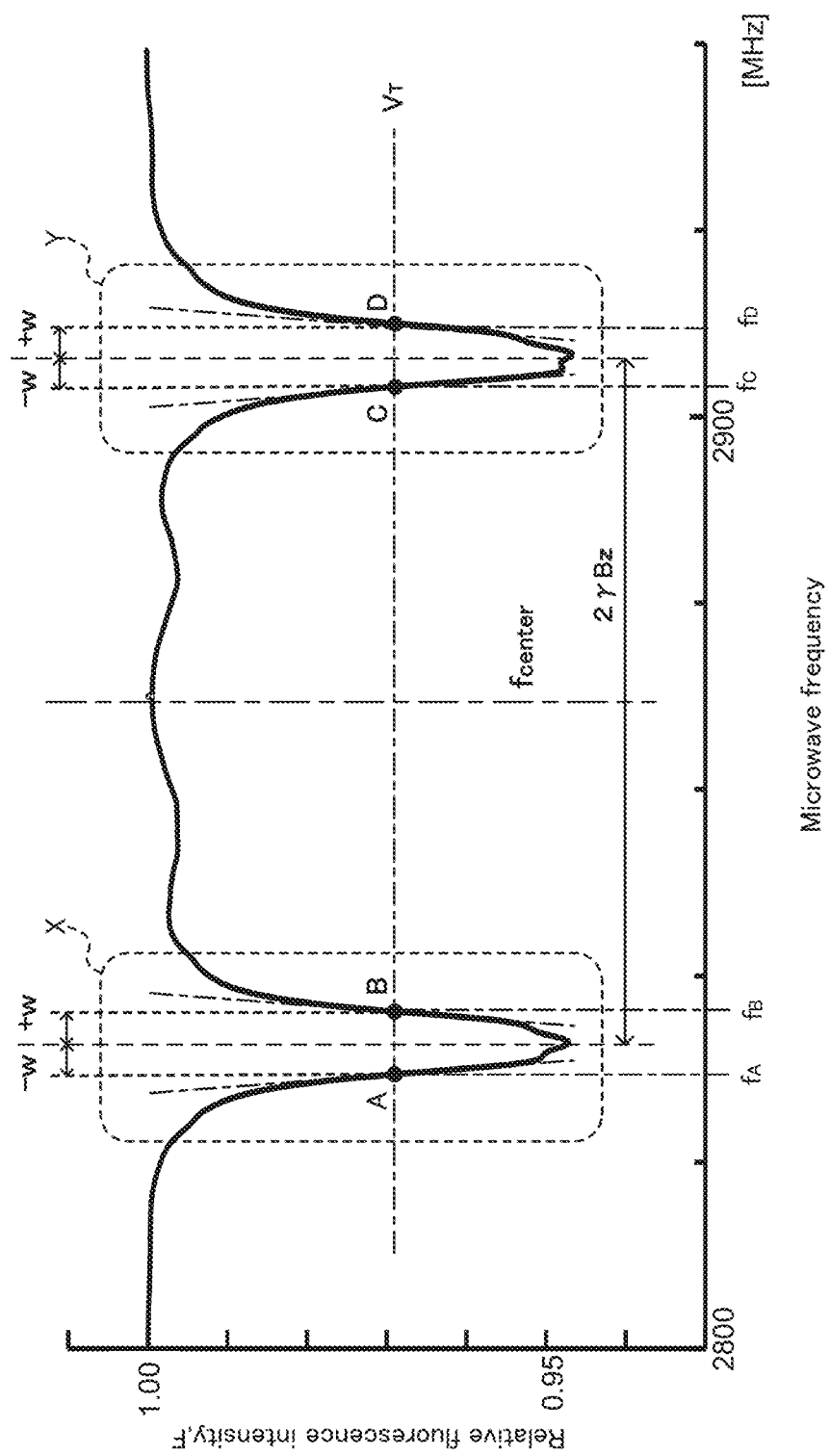
FIG. 4 is a graph showing an example of an optically detected microwave resonance spectrum of the diamond plate after Zeeman splitting in a static magnetic field.

Now, a function of the determination part 70 will be described with reference to FIG. 4. FIG. 4 is a graph showing an example of the optically detected microwave resonance (ODMR) spectrum of the diamond plate 2 after Zeeman splitting in the static magnetic field.

The optically detected microwave resonance spectrum (hereinafter referred to as an ODMR spectrum) indicates a degree to which the intensity of the fluorescence emitted by the NV layer of the diamond plate 2 decreases when the microwave irradiation part 3 irradiates the diamond plate 2 with the microwave relative to when not irradiating with the microwave, with respect to changes in microwave frequency.

In other words, when the fluorescence intensities detected during the periods of time in which the microwave is turned off and on are represented as Foff and Fon, respectively, the relative fluorescence intensity is defined as (Foff−Fon)/Foff.

Here, in the ODMR spectrum, a portion where the relative fluorescence intensity decreases at a microwave frequency at which magnetic resonance occurs is defined as a "valley". In the absence of an external magnetic field, one "valley" appears near 2870 MHz.

Since NV centers generally exist in four orientations as the crystal orientations of the diamond, when the external magnetic field is applied, the "valley" is generally split into two or four (or more) according to the crystal orientations. As described above, it is known that, in the plane (111) of the diamond plate 2, NV axes are aligned 100% unidirectionally (a direction perpendicular to the plane (111)). In this case, when the magnetic field Bz of the z direction is applied, the number of "valleys" is two as shown in FIG. 4.

Note that the ODMR spectrum including the two "valleys" as shown in FIG. 4 is similarly observed in each pixel of the image sensor 5, in an average of a certain area including a plurality of pixels, or in an average of the entire visual field. However, when an average of the entire visual field in which the total amount of light increases is observed, the influence of the shot noise is minimized, and the ODMR spectrum becomes clear.

Note that, for example, when ambient temperature is changed, the ODMR spectrum is wholly shifted in parallel in the frequency direction of the microwave according to temperature change.

Hereinafter, the ODMR spectrum refers to an average spectrum in the visual field unless otherwise indicated as "for each pixel" or "of a pixel". When four or more "valleys" exist in the ODMR spectrum, two "valleys" in a pair which are symmetrical about near 2870 MHz are used.

For example, the determination part 70 identifies, based on the detection result of the image sensor 5, two positive and negative maximum inclination points from each of two "valleys" X and Y where the relative fluorescence intensity decreases in the ODMR spectrum of the diamond plate 2 after the Zeeman splitting. The "valley" X where the relative fluorescence intensity decreases has a negative maximum inclination point A and a positive maximum inclination point B. The "valley" Y where the relative fluorescence intensity decreases has a negative maximum inclination point C and a positive maximum inclination point D.

Then, the determination part 70 determines a degree of decrease in the fluorescence intensity at each of the identified four maximum inclination points A, B, C, and D, and the frequencies fA, fB, fC, and fD at the respective points. For example, the degree of decrease in the fluorescence intensity is a value obtained by subtracting, for example, the relative fluorescence intensity at each maximum inclination point from relative fluorescence intensity of 1.00. Furthermore, the degree of decrease in the fluorescence intensity may be other values that can relatively indicate the degree of decrease in the fluorescence intensity.

Generally, portions that form the steepest inclined surfaces on both sides of each of the two "valleys" are positioned at a depth of 60 to 75% of the depth of the "valley." As will be described later, to obtain the magnetic distribution from the fluorescence intensity distribution in the microwave frequencies at the respective maximum inclination points A, B, C, and D, since the ODMR spectrum is assumed to have symmetry, it is essential that the depths of the "valleys" are the same.

Then, as described above, the phase of the microwave is adjusted by the phase shifter 32 to equalize the depths of the "valleys." Nevertheless, the depths at which the inclined surfaces of the "valleys" become the steepest may be different from one another among the maximum inclination points A, B, C, and D.

Therefore, the setting part 71 sets a reference decrease degree $V_T$ of the common relative fluorescence intensity based on the degree of decrease in the fluorescence intensity at each maximum inclination point determined by the determination part 70. For example, when the depths of the respective maximum inclination points A, B, C, and D are different from one another, the setting part 71 sets the reference decrease degree $V_T$ by averaging the depths. Then, the setting part 71 determines initial values $fA_0$, $fB_0$, $fC_0$, and $fD_0$ of the microwave frequencies fA, fB, fC, and fD at respective operating points A, B, C, and D at which the relative fluorescence intensity of the ODMR spectrum corresponds to the reference decrease degree $V_T$.

The microwave frequencies fA, fB, fC, and fD at the respective operating points A, B, C, and D corresponding to the set reference decrease degree $V_T$ are approximated by the following equations (1) to (4). In addition, fcenter is represented by the following equation (5).

[Math. 1]

$$fA = \text{fcenter} - \gamma \cdot Bz - w \qquad (1)$$

[Math. 2]

$$fB = fcenter - \gamma \cdot Bz + w \quad (2)$$

[Math. 3]

$$fC = fcenter + \gamma \cdot Bz - w \quad (3)$$

[Math. 4]

$$fD = fcenter + \gamma \cdot Bz + w \quad (4)$$

[Math. 5]

$$fcenter = f0 - \varepsilon \cdot T \quad (5)$$

Where
$f_0$ = a constant value near 2870 MHz
T: Absolute temperature
γ: Gyromagnetic ratio 28.07 [MHz/mT]
w: Width from a center of a "valley" of the ODMR spectrum
ε: Constant From the above equations (1) to (4), the following equation (6) is derived.

[Math. 6]

$$Bz = (-fA - fB + fC + fD)/(4 \cdot \gamma) \quad (6)$$

w is inversely proportional to the coherence time of the electron spin of the NV center and depends on the local quality of the NV layer. However, the above equation (6) contains no terms depending on T and w and therefore Bz can be accurately detected. Thus, by calculating the relationship among the four operating points by the above equation (6), it is possible to detect the magnetic field Bz except for the temporal variations in temperature and the spatial fluctuation of the electron spin coherence time.

Then, the frequency update part 73 updates the operating point frequencies at the four points so that the degree of decrease in the relative fluorescence intensity at the frequency at each of the four operating points approaches the reference decrease degree $V_T$.

The frequency correction part 72 inputs, to the microwave oscillator 30, the operating point frequencies updated by the frequency update part 73 as the corrected operating point frequencies.

Next, operation and processing of the magnetic measuring device 1 will be described. Here, the process until the result for the magnetism detected by the magnetic measuring device 1 is output as an image will be described by being divided into initial setting processing for calibrating various parameters, integrated image time-lapse capture processing at regular time intervals, such as cell measurement for a long period of time, and data correction processing for correcting data obtained by the integrated image time-lapse capture processing for each pixel.

<Initial Setting Processing>

An operator places the diamond plate 2 on the microscope stage 10, determines the relative position among the static magnetic field application part 20, the microwave coil 340, the diamond plate 2, and the objective lens 42, and the wiring state of the microwave coil 340 in the microwave irradiation part 3, and then performs the following initial setting processing only once via the input part 60 and the like. However, when the focal point of the objective lens 42 moves to a different position on the diamond plate 2, it is necessary to perform initial setting again.

<1> The frequency of the microwave emitted by the microwave irradiation part 3 is swept in the frequency range including the deepest portions of the two "valleys" described above, and the ODMR spectrum is measured to identify the frequency positions of the deepest portions of the two "valleys".

<2> The phase shifter 32 adjusts the phase of the microwave supplied to the microwave coil 340, and aligns the depths of the deepest portions of the two "valleys."

<3> In a state in which the depths of the two "valleys" are aligned with each other, the ODMR spectrum is integrated for a predetermined period of time (for example, a few minutes to a few tens of minutes) in the frequency range including the two "valleys," and the depth of the "valley" in the ODMR spectrum for each pixel is stored in the memory 602. The variation in depth of the "valley" for each pixel is caused by non-uniformity of the density, thickness, and film quality of the NV layer and the excitation light or microwave in the visual field.

<4> After making the average ODMR spectrum in the visual field clear by the above-described processing <3>, there are set the reference decrease degree $V_T$ with respect to the average ODMR spectrum in the visual field, and $fA_0$, $fB_0$, $fC_0$, and $fD_0$ as initial values at the time of the frequency-integrated image time-lapse capture processing of the operating point frequencies fA, fB, fC, and fD at the four points corresponding to the reference decrease degree $V_T$.

<Integrated Image Time-Lapse Capture Processing>

Next, the operator performs processing for integrating the relative fluorescence intensity for each pixel via the input part 60 and the like.

<5> The relative fluorescence intensity for each pixel at each of the microwave frequencies fA, fB, fC, and fD is integrated N times (for example, N=10).

<6> Averages in the visual field of the relative fluorescence intensities integrated for each pixel are taken to obtain relative fluorescence intensities VA, VB, VC, and VD, and the updated microwave frequencies fAnew, fBnew, fCnew, and fDnew are calculated and set according to the following equations (7) to (10).

[Math. 7]

$$fAnew = fA + (VA - VT) \cdot S \cdot K \quad (7)$$

[Math. 8]

$$fBnew = fB - (VB - VT) \cdot S \cdot K \quad (8)$$

[Math. 9]

$$fCnew = fC + (VC - VT) \cdot S \cdot K \quad (9)$$

[Math. 10]

$$fDnew = fD - (VD - VT) \cdot S \cdot K \quad (10)$$

Here, S and K are constants which will be described later.

<7> The integrated value of the relative fluorescence intensity for each pixel at the time point when the above-described <5> and <6> are repeated M times is stored in the memory 602 as a file. Then, the integrated values for each pixel are cleared (initialized) once, and the processing is returned to the processing <5> to start the integration again. However, the microwave frequencies are not initialized, and fAnew, fBnew, fCnew, and fDnew obtained in the processing <6> of the previous cycle are used as fA, fB, fC, and fD, respectively.

The value of M is set depending on the degree of clearness and the interval of dynamic measurements. For example, M is 3.

<8> The processing <5>, <6>, and <7> described above is repeated for a required observation period of time (for example, several days), and each result is stored in the memory 602.

<Data Correction Processing>

Next, the operator causes the control part 6 to execute image processing using the results stored in the memory 602 by the integrated image time-lapse capture processing.

<9> The result obtained by the processing <7> described above are corrected by the depth of the "valley" in the ODMR spectrum for each pixel obtained by the processing <3>, and the correct magnetism image showing the two-dimensional distribution of the magnetic intensities is output to the output part 62. This processing is not necessarily performed in real time. Furthermore, when the obtained magnetic images are continuously output, a time-lapse captured moving image is obtained.

Next, the processing performed by the magnetic measuring device 1 will be specifically described.

Figure 5A:
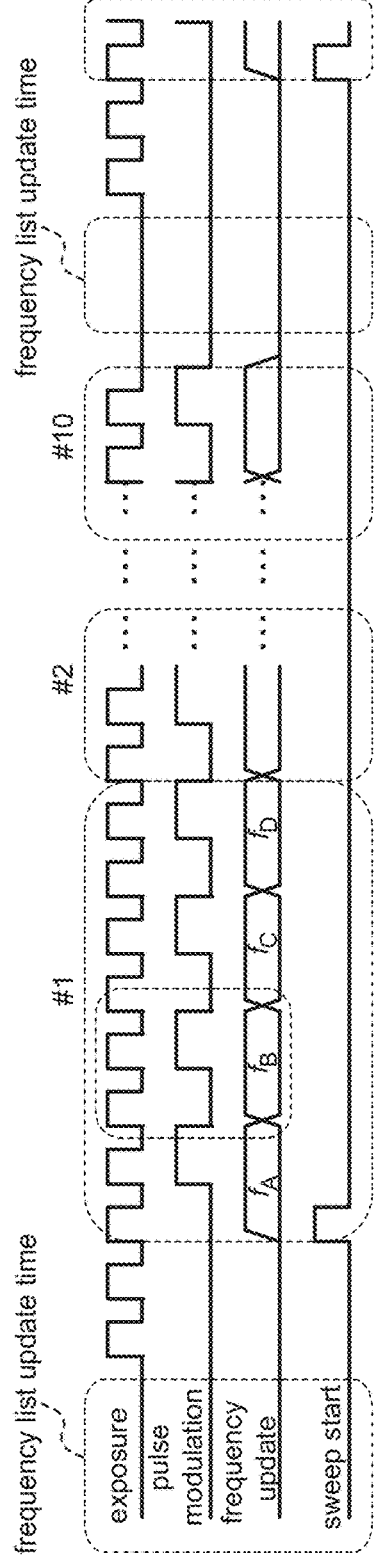
FIG. 5(*a*) is a timing chart showing a timing at which a microwave oscillator switches a microwave frequency according to a predetermined frequency list.
Figure 5B:
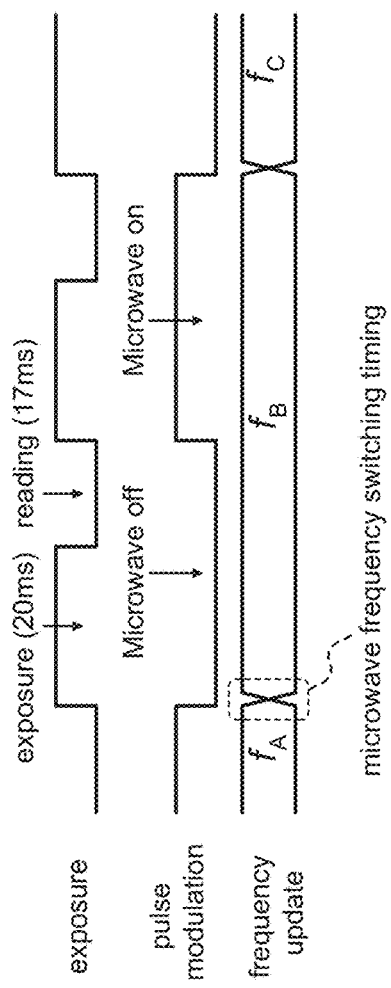

FIG. 5 is a timing chart showing switching timing of the microwave frequency by the microwave oscillator 30. FIG. 5(*a*) is a timing chart showing a timing at which the microwave oscillator 30 switches the microwave frequency according to a predetermined frequency list. FIG. 5(*b*) is a timing chart showing a signal switching timing when the microwave frequency is fB in FIG. 5(*a*).

When the above-described processing <5> and <6> is performed, the magnetic measuring device 1 integrates the relative fluorescence intensity for each pixel while sequentially switching the microwave frequencies fA, fB, fC, and fD within a predetermined period of time. Then, the magnetic measuring device 1 performs feedback to reflect the average value of the integrated results in the visual field to the microwave frequency, which is followed by the operating points A, B, C, and D at which the degree of decrease in the average fluorescence intensity in the visual field at the microwave frequencies fA, fB, fC, and fD becomes the reference decrease degree $V_T$.

The microwave oscillator 30 (FIG. 1) has a list sweep function of changing the microwave frequency in synchronization with the frequency update signal 308 based on the frequency list received in advance from the control part 6. First, the control part 6 sets the microwave frequencies fA, fB, fC, and fD as the frequency list for the list sweep to the microwave oscillator 30 at the first frequency list update time. Thereafter, the microwave oscillator 30 repeats the generation of microwaves of the microwave frequencies fA, fB, fC, and fD N times.

As shown in FIG. 5(*b*), one cycle of the frequency update signal 308 has a microwave off period of 50% and a microwave on period of 50% (duty ratio: 50%). The microwave frequency switching timing is within the microwave off period, so that a stable microwave frequency is maintained within the microwave on period. The microwave off period and the microwave on period include an exposure period of time (for example, 20 ms) and a read time (for example, 17 ms) of the image sensor 5, respectively.

A measurement time period of one cycle for switching the microwave frequencies fA, fB, fC, and fD includes eight cycles in total of the exposure period of time and the read time of the image sensor 5 when the microwave is on at each microwave frequency and the exposure period of time and the read time of the image sensor 5 when the microwave is off. When the exposure period of time is 20 ms and the read time is 17 ms, the measurement time period of one cycle is 296 ms.

Even if a temperature change occurs slower than the above-described time period of one cycle while the magnetic measuring device 1 performs the measurement, the influence is canceled by the above equation (6). Then, the magnetic measuring device 1 switches the microwave frequencies fA, fB, fC, and fD and repeats one cycle N times, thereby acquiring and accumulating the relative fluorescence intensities at the microwave frequencies fA, fB, fC, and fD.

Thereafter, averages in the visual field of the relative fluorescence intensities at the microwave frequencies fA, fB, fC, and fD are determined as VA, VB, VC, and VD, respectively.

On the other hand, by the previous measurement, the reference decrease degree $V_T$ of the average ODMR in the visual field is determined. And, the values of the microwave frequencies fAnew, fBnew, fCnew, and fDnew in the next iterations performed N times are calculated by the above equations (7) to (10) from the microwave frequencies fA, fB, fC, and fD repeatedly used N times in the performed process of accumulating fluorescence intensities in the visual field and the relative fluorescence intensities VA, VB, VC, and VD in the visual field obtained at the respective microwave frequencies.

Figure 6:
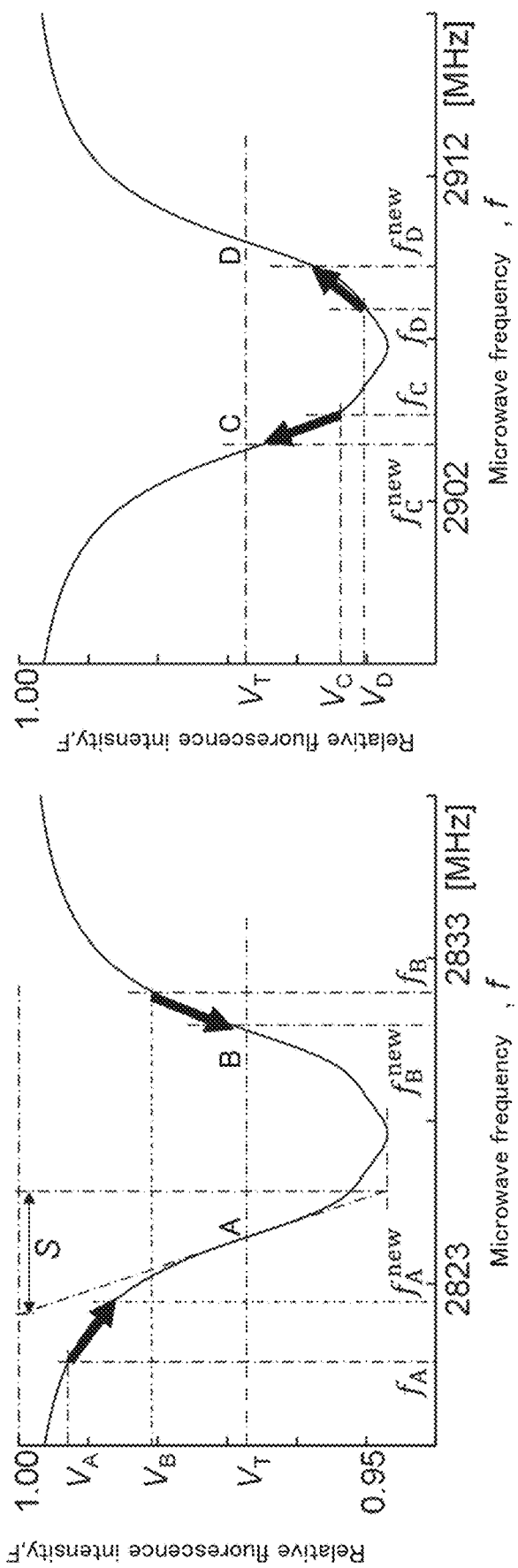
FIG. 6 is a graph conceptually showing a process of converging an operating point to a frequency corresponding to a reference decrease degree $V_T$ when the relative fluorescence intensity in the visual field at each of the microwave frequencies fA, fB, fC, and fD as the operating points deviates from the reference decrease degree $V_T$ which is a target value.

FIG. 6 is a graph conceptually showing a process of converging an operating point to a frequency corresponding to a reference decrease degree VT when the relative fluorescence intensity in the visual field at each of the microwave frequencies fA, fB, fC, and fD as the operating points deviates from the reference decrease degree $V_T$ which is a target value. FIG. 6(*a*) is a graph conceptually showing a process of converging an operating point at each of the microwave frequencies fA and fB in the "valley" on a lower frequency side to a frequency corresponding to the reference decrease degree $V_T$. FIG. 6(*b*) is a graph conceptually showing a process of converging an operating point at each of the microwave frequencies fC and fD in the "valley" on a higher frequency side to a frequency corresponding to the reference decrease degree $V_T$.

Here, S is an absolute value of the inverse number of the inclination, and the tangent at the operating point on the ODMR spectrum is defined as a difference between the frequency positions which intersect the peak of the ODMR spectrum and the horizontal line of the height of the bottom of the valley, respectively. K is a constant for convergence adjustment, and f and S have units of MHz. When the minimum value of the relative fluorescence intensity is about 0.95 as shown in FIG. 4, K is set to 100, for example. S in the MHz unit was 3600.

Then, the microwave frequencies fAnew, fBnew, fCnew, and fDnew are set in the microwave oscillator 30 at the next frequency list update time. After the frequency list update time, the microwave oscillator 30 repeats the sequence of microwave frequencies fAnew, fBnew, fCnew, and fDnew N times.

Thus, FIG. 6 shows a process of updating the frequency from the microwave frequency fA, fB, fC, fD to the microwave frequency fAnew, fBnew, fCnew, fDnew, when VA-$V_T$, VB-$V_T$, VC-$V_T$, VD-$V_T$ is not zero. Then, the microwave frequency fAnew, fBnew, fCnew, fDnew approaches the target operating point A, B, C, D rather than the microwave frequency fA, fB, fC, fD, and converges to the operating point A, B, C, D by repeating the procedures of <5> and <6>.

Next, the process of obtaining a magnetic image will be described in detail by correcting the depth of the "valley" in the ODMR spectrum for each pixel by the processing <9> from the integrated value of the relative fluorescence intensity for each pixel by the processing <7>.

Figure 7:
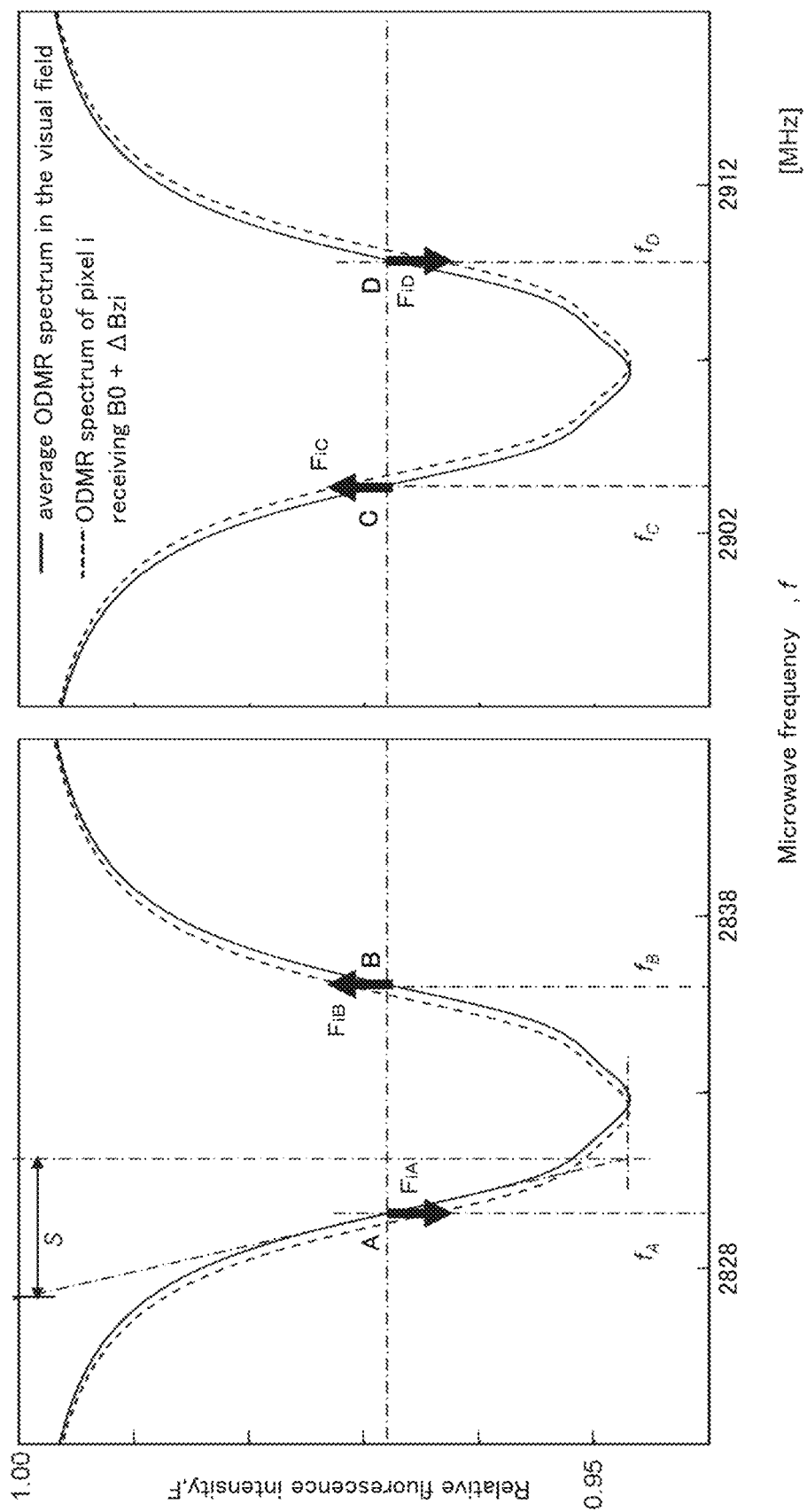
FIG. 7 is a graph conceptually showing processing performed in a process of calculating a magnetic field distribution from a distribution of the relative fluorescence intensity.

FIG. 7 is a graph conceptually showing processing performed in a process of calculating a magnetic field distribution from a distribution of the relative fluorescence intensity.

The magnetic field Bz in the diamond plate 2 includes an external static magnetic field Bo and a local magnetic field ΔBz generated by the magnetic particles 22 magnetized by the external static magnetic field Bo. Here, Bz, Bo, and ΔBz have the following relationship (11).

[Math. 11]

$$Bz = Bo + \Delta Bz \quad (11)$$

When the magnetic particles 22 are sparsely distributed on the diamond plate 2, the average Bz in the visual field is approximately equal to $B_0$. Therefore, Bz obtained by the above equation (6) becomes $B_0$ with respect to the average ODMR spectrum in the visual field.

Then, ΔBz is reflected to the change from the average ODMR spectrum in the visual field of the ODMR spectrum for each pixel. Since the reference decrease degree VT is the average ODMR spectrum in the visual field at the microwave frequencies fA, fB, fC, and fD, FiA, FiB, FiC, and FiD are assumed to be changes from the reference decrease degree VT of the relative fluorescence intensities at the microwave frequencies fA, fB, fC, and fD in the i-th pixel, respectively.

When ΔBz at the i-th pixel is assumed to be ΔBzi, FiA <0, FiB >0, FiC >0, and FiD <0 are established in the case where ΔBzi >0 is established as shown in FIG. 7. When there is no variation in the depth of the "valley" of the ODMR spectrum in the visual field, ΔBzi is represented by the following equation (12).

[Math. 12]

$$\Delta Bzi = (-FiA + FiB + FiC - FiD) \cdot S/(4\gamma) \quad (12)$$

In general, however, variations in the depth of the "valley" of the ODMR spectrum for each pixel may occur. Also, the depth of the "valley" on the lower frequency side and the depth of the "valley" on the higher frequency side may be different from each other. This is because, although as the depths of the two "valleys" are aligned as the average in the visual field in the processing <2>, the two "valleys" does not always have the same depth in all the pixels at the same time.

When the depth of the "valley" in the average in the visual field is represented as Pave, the depth of the "valley" on the lower frequency side of the i-th pixel is represented as Pil, and the depth of the "valley" on the higher frequency side of the i-th pixel is represented as Pih, ΔBzi is represented by the following equation (13).

[Math. 13]

$$\Delta Bzi(-(FiA - FiB) \cdot Pave/Pil + (FiC - FiD) \cdot Pave/Pih) \cdot S/(4\gamma) \quad (13)$$

Figures 8A, 8B, 8C:
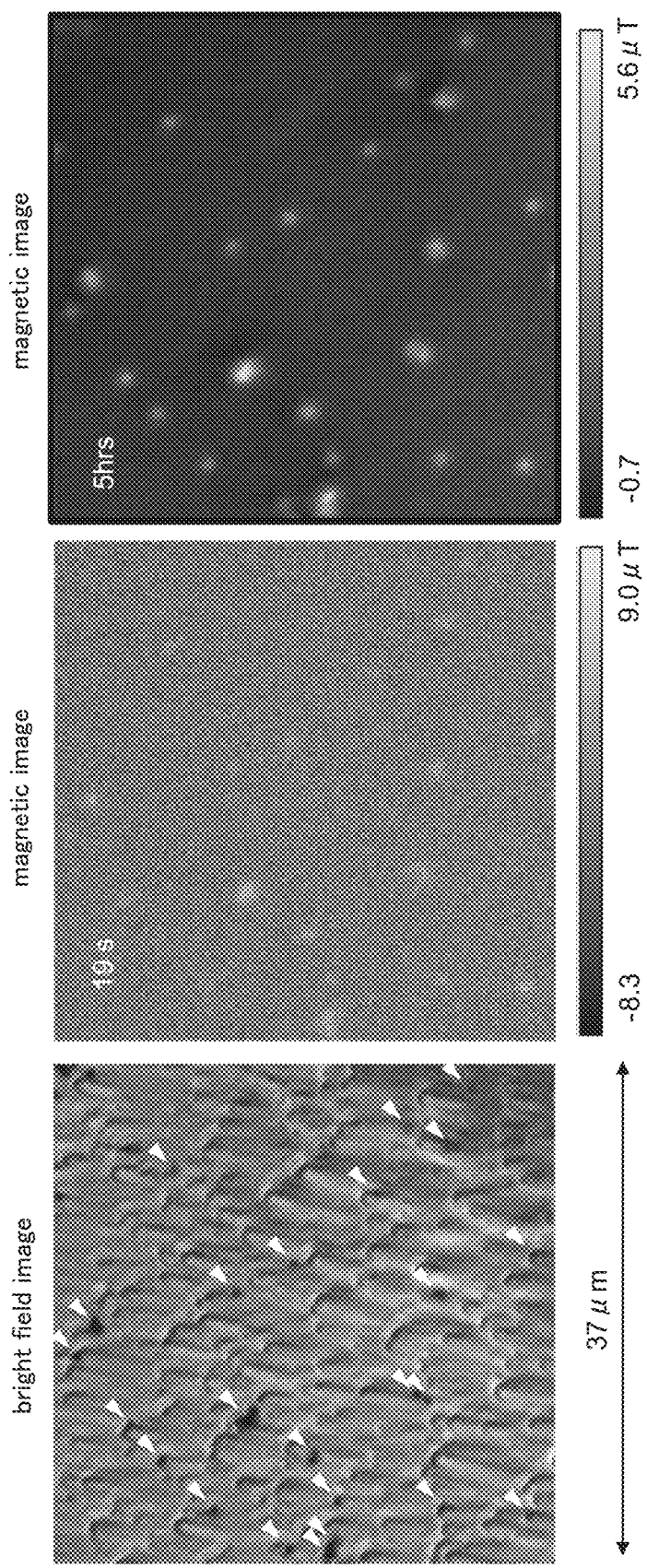
FIG. 8(*a*) is a photograph showing a bright field image.

FIG. 8 is a photograph showing an example of an image output by the magnetic measuring device 1. FIG. 8(a) is a photograph showing a bright field image. FIG. 8(b) shows a photograph showing a magnetic image integrated for a relatively short period of time in the visual view. FIG. 8(c) is a photograph showing a magnetic image integrated for a relatively long period of time in the visual field.

The image in FIG. 8 is an image in the case where the NV concentration is $1.6 \times 10^{16}/cm^3$, the orientation ratio in the (111) direction is 100%, the thickness td of the NV layer is 3.5 μm, the external static magnetic field is 1.3 mT, and the diameter of the magnetic particle 22 is 1 μm. From the image shown in FIG. 8, the control part 6 acquires the fact that peak of the bright point as a magnetic image is 2.4 μT in average by performing the calculation.

This actual measured value of 2.4 μT is compared with a simulation value as follows.

Since the magnetic field generated by the magnetic particles 22 decreases sharply with approximately third power of the distance, the influence, on the image, of the fluorescence generated from the NV center around the magnetic particles 22 is examined in detail. Here, a simulation is performed in consideration of the diffraction limit of Abbe.

Figure 9:
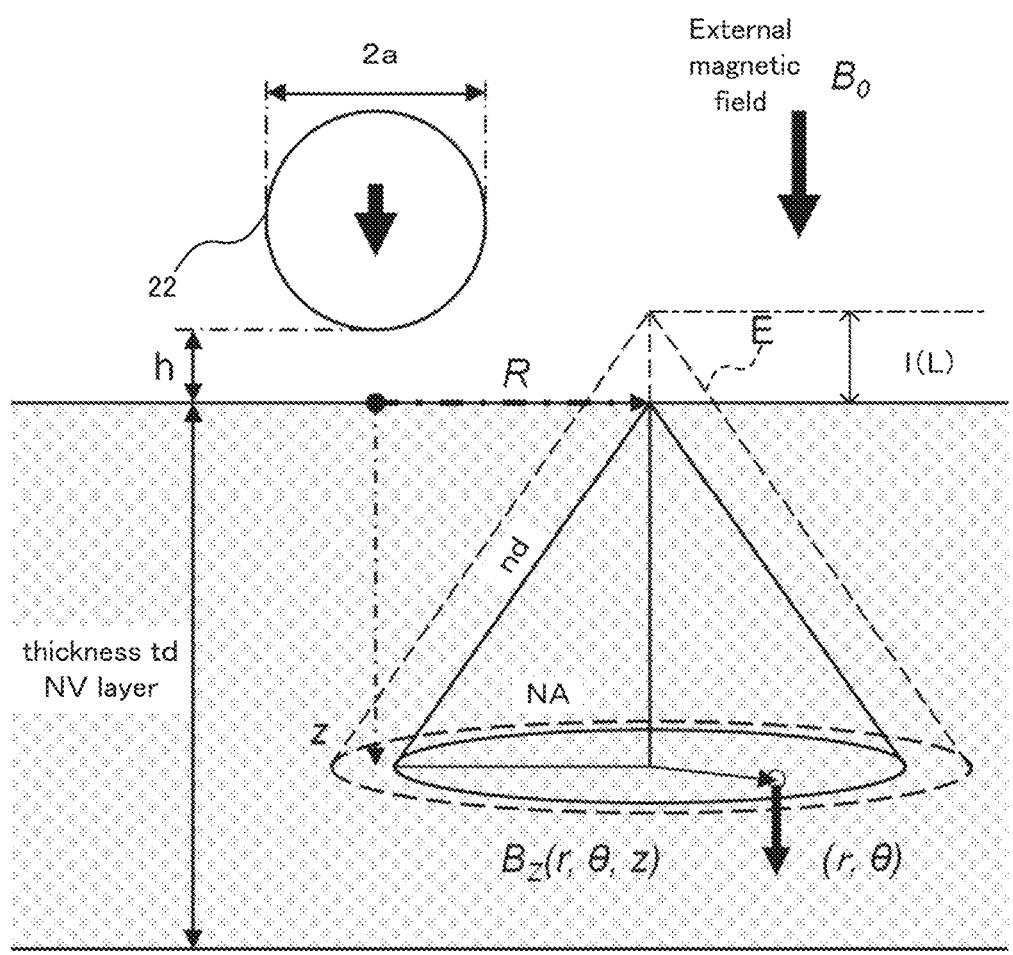
FIG. 9 is a diagram illustrating a model for simulating the influence, on an image, of the fluorescence generated from the NV center around the magnetic particles.

FIG. 9 is a diagram illustrating a model for simulating the influence, on an image, of the fluorescence generated from the NV center around the magnetic particles 22. In the magnetic measuring device 1, the diamond plate 2 is observed from the back surface via the plate having a thickness of 0.30 mm by the objective lens 42 having, for example, a magnification of 60, NA of 1.30, and WD of 0.30 mm.

Here, it is assumed that the magnetic spheres (magnetic particles 22) having a radius a of 0.5 μm are spaced apart from the surface of the diamond plate 2 at a height of h. A coordinate axis of (R, Θ) is taken on the surface of the diamond plate 2. The z-axis is taken to be perpendicular to the diamond plate 2. The focal point of the microscope (captured image) is positioned on the surface of the diamond plate 2.

At this time, with respect to the fluorescence I (R, Θ) detected by the pixel of the image sensor 5 to which the coordinates (R, Θ, 0) of the diamond plate 2 is projected, it is necessary to consider the entire fluorescence generated in a certain cone.

The apex of the cone is (R, Θ, −1) and the apex angle is arcsin (NA/nd). The height of the cone is (td+1). Here, 1 is the diffraction limit of Abbe and is 0.34 μm for the fluorescence of the NV center.

NA is the numerical aperture of the objective lens. nd is the refractive index of diamond.

The fluorescence generated at the coordinates (r, θ, z) in the cone reaches a pixel with a probability distribution that depends on R2+r2 −2rRCos (Θ−θ) and z. First, the magnetic field Bz (r, θ, z) at the coordinates (r, θ, z) that affects the fluorescence of the NV center in the cone is determined.

The magnetization Mz of the magnetic sphere in the uniform external magnetic field Bz is represented by the following equation (14).

[Math. 14]

$$Mz = \Omega \cdot Bo \quad (14)$$

The magnetic susceptibility x of the magnetic particles 22 used here was 0.8 from the literature value. The magnetic field generated by uniformly magnetized magnetic spheres is equal to the magnetic field when all magnetic moments are present at the center of the sphere. In the measurement in FIG. 8, since all the NV axes are parallel to the z-axis, only the ΔBz of the z-component of the magnetic field is considered as the magnetic field of the magnetic particles 22 that affect the fluorescence intensity.

ΔBz is represented by the following equation (15).

[Math. 15]
$$\Delta B_z = M_z a^3 \frac{2(z+a+h)^2 - r^2}{3\left[(z+a+h)^2 + r^2\right]^{5/2}} \quad (15)$$

I (R, Θ) is represented by the following formula (16).

[Math. 16]
$$I(R, \Theta) = \int_{-1}^{+t_d} dz \int_0^{2\pi} d\theta \int_0^\infty r dr F(r, \theta, z) \frac{1}{2\pi\sigma^2} \exp\left[-\frac{r^2 + R^2 - 2rR\cos(\theta - \Theta)}{2\sigma^2}\right] \quad (16)$$

Here, F (r, θ, z) represents the fluorescence intensity generated at the coordinates (r, θ, z), and σ2 is represented by the following equation (17).

[Math. 17]
$$\sigma^2 = \frac{(z+l)^2}{(n_d/NA)^2 - 1} \quad (17)$$

Thus, deeper depths correspond to wider ranges of fluorescence. F (r, θ, z) is represented by the following equations (18), (19), and (20) by a Lorentz curve when it is not necessary to consider a hyperfine level by the $^{14}$N nuclear spin.

[Math. 18]
$$F(r, \theta, z) = F_0 \sum_{m_e = \pm 1} \frac{1}{1 + (2\pi\tau(f - f_0 - m_e \gamma B_z))^2} \quad (18)$$

[Math. 19]
$$f_0 = 2870 \text{ MHz} + \Delta f_0 \quad (19)$$

[Math. 20]
$$B_z = B_0 + \Delta B_z \quad (20)$$

In consideration of γ representing the gyromagnetic ratio of 28.07 [MHz/mT], τ representing the electron spin coherence time of the NV center, and the hyperfine level of $^{14}$N nuclear spin, the following equations (21) and (22) can be obtained.

[Math. 21]
$$F(r, \theta, z) = F_0 \sum_{m_N = 0, \pm 1} \sum_{m_e = \pm 1} \frac{1}{1 + (2\pi\tau(f - f_0 - m_e m_N A - m_e \gamma B_z))^2} \quad (21)$$

[Math. 22]
$$A = 2.16 \text{ MHz} \quad (22)$$

Figure 10:
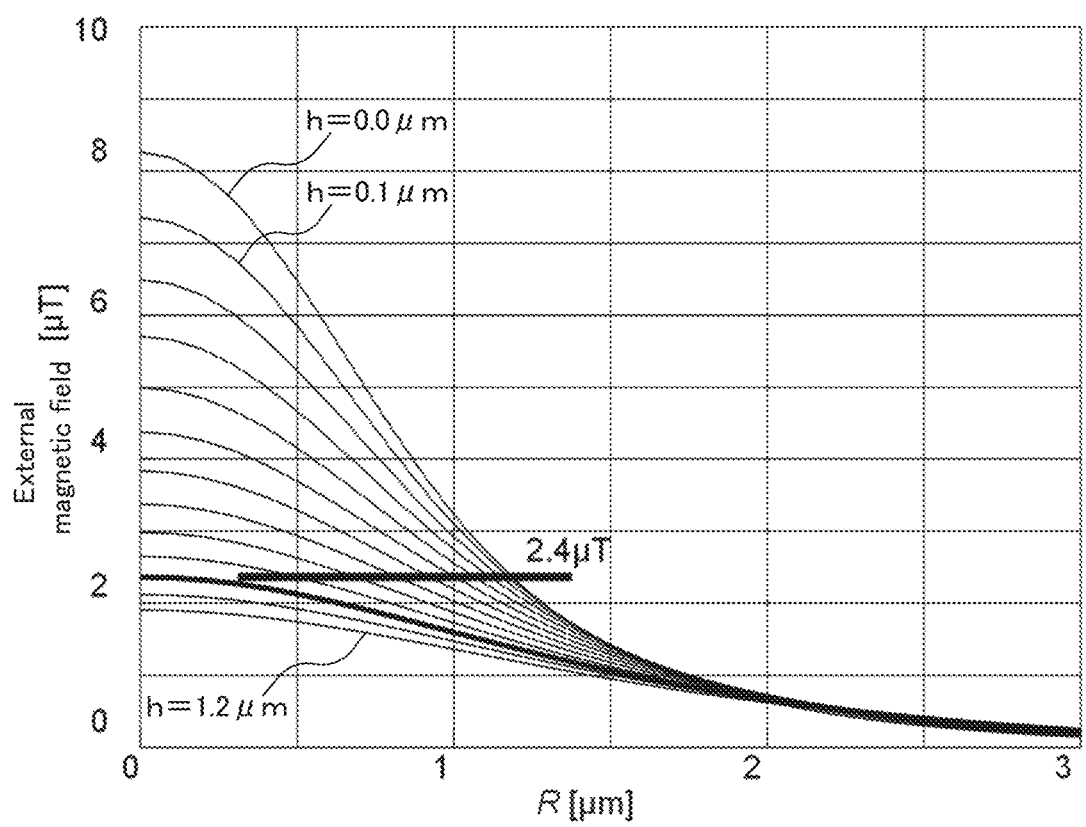
FIG. 10 is a graph showing consistency between an actual measured value and a simulation value.

When Δf0=−0.3 MHz, B0=1.31 mT, τ=82 ns obtained from an average value in the visual field of the ODMR spectrum are applied to the above equation, it has been found that the actual measured value is best consistent with the simulation value in the case of h=1.0 μm, as shown in FIG. 10.

When the surface unevenness of the diamond plate 2 was measured by an atomic force microscope (AFM), the surface unevenness was 20 to 50 nm. However, in the case of comparison between the actual measured value and the simulation value of the magnetic image, there is a possibility that some type of film is generated in the gap between the magnetic particles 22 and the diamond plate 2 as a cause that the distance between the magnetic particles 22 and the diamond plate 2 appears to be about 1 μm.

When the NV layer had a constant density, a change in magnetic field intensity immediately below the magnetic particles 22 detected as a change in the ODMR spectrum, depending on the thickness of the NV layer, was examined by simulation according to the model shown in FIG. 9.

Figure 11:
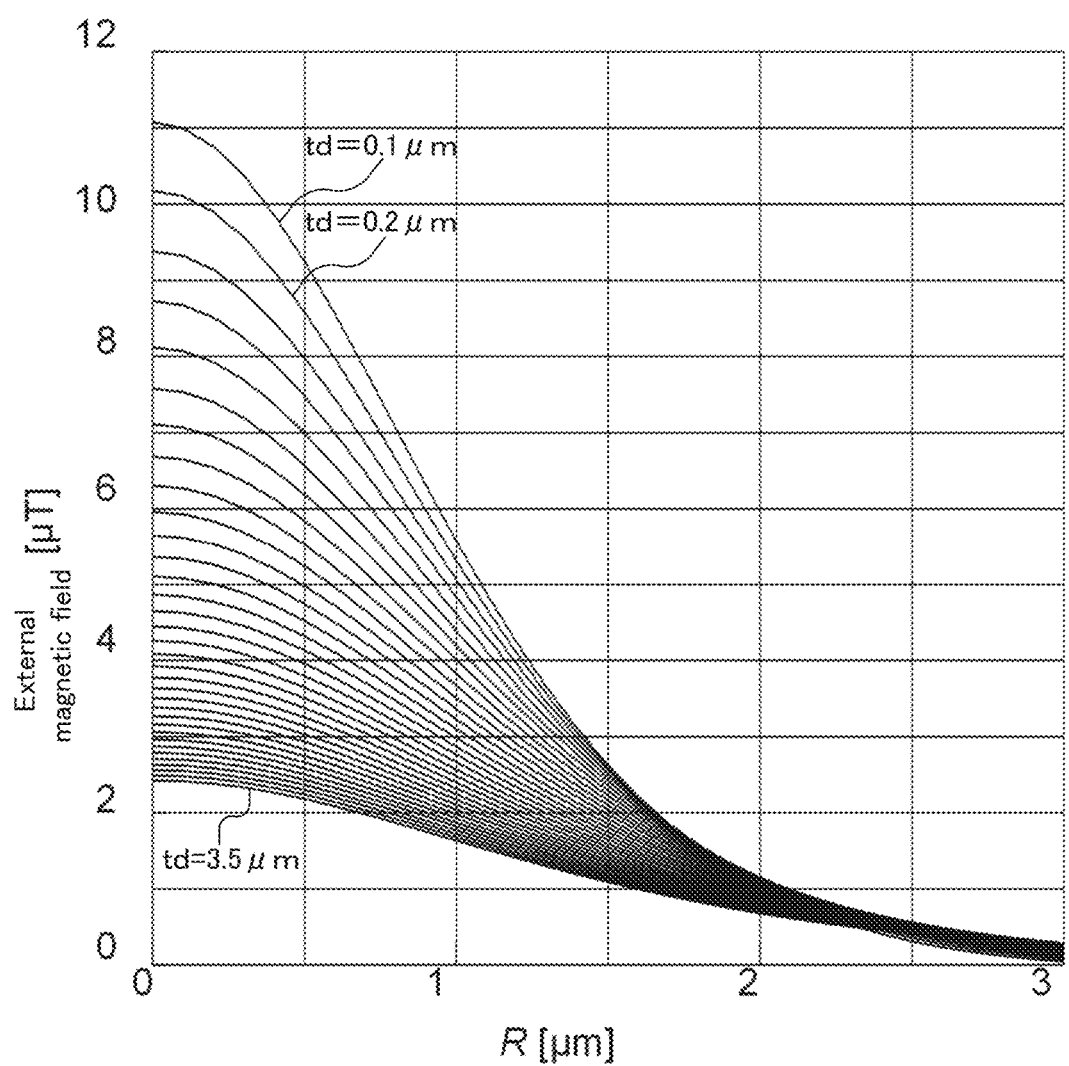
FIG. 11 is a graph showing dependence of the magnetic field intensity distribution on a distance from immediately below the magnetic particles when h is 1.0 μm.
Figure 12:
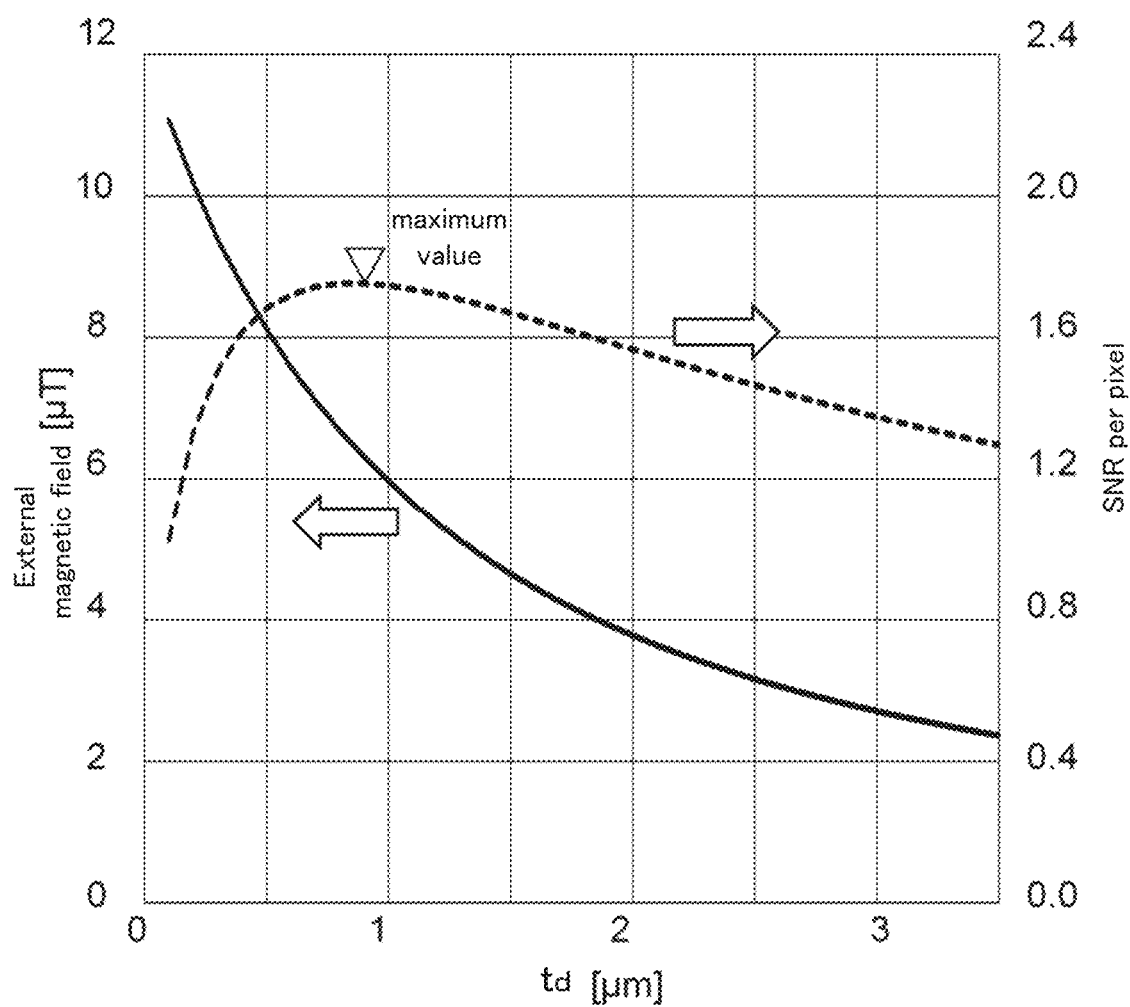
FIG. 12 is a graph showing dependence (solid line) of a peak value of magnetic field intensity distribution on an NV layer thickness td, and an SNR (broken line line) of shot noise per pixel and the peak value of the magnetic field intensity distribution.

FIG. 11 is a graph showing the dependence of the magnetic field intensity on the distance R from immediately below the magnetic particles 22 when h is 1.0 μm. FIG. 12 is a graph in which a solid line indicates the dependence of a peak value of the magnetic field intensity distribution on an NV layer thickness td.

As the NV layer thickness td becomes thinner, the peak value of the magnetic field intensity distribution becomes larger. On the other hand, since the fluorescence intensity is proportional to the NV layer thickness td, as the NV layer thickness td is smaller, the shot noise becomes relatively larger. The magnitude of the shot noise is calculated from the standard deviation of the difference for each pixel between FIGS. 8(b) and 8(c) and the exposure period of time required for acquisition in FIG. 8(b).

In addition, a broken line in FIG. 12 indicates a signal-to-noise ratio (SNR) of the calculated shot noise per pixel and the peak value of the magnetic field intensity distribution. As indicated by a mark ∇ on the broken line in FIG. 12, the SNR is maximized when the NV layer thickness td is 0.9 μm. However, it can be said that the reduction in SNR at NV layer thickness td >0.9 μm is slow and the reduction in SNR with respect to a change in NV layer thickness td from 0.9 μm to 1.0 μm is slight (−0.3%), such that the reduction in SNR is approximately the best even when the NV layer thickness td is 1.0 μm.

Here, although the absolute value of the shot noise decreases with the binning of the pixel or integration time, the way of decrease is uniform regardless of the NV layer thickness td. Therefore, there is no change in the value of the NV layer thickness td, which is best as the SNR.

As described above, when the density of the NV layer is constant, it can be said that the thickness of NV layer which is best for detecting the magnetic particles 22 having the radius a is about 2a (a diameter of the magnetic particle 22).

Next, an embodiment of measuring the magnetism using the magnetic measuring device 1 will be described.

The magnetic measuring device 1 makes it possible to track the movement of the cells which move over a long period of time by, for example, depositing magnetic particles 22 on live moving cells which are cultivated in a dish and detecting the change in magnetism by the magnetic particles 22.

Figure 13:
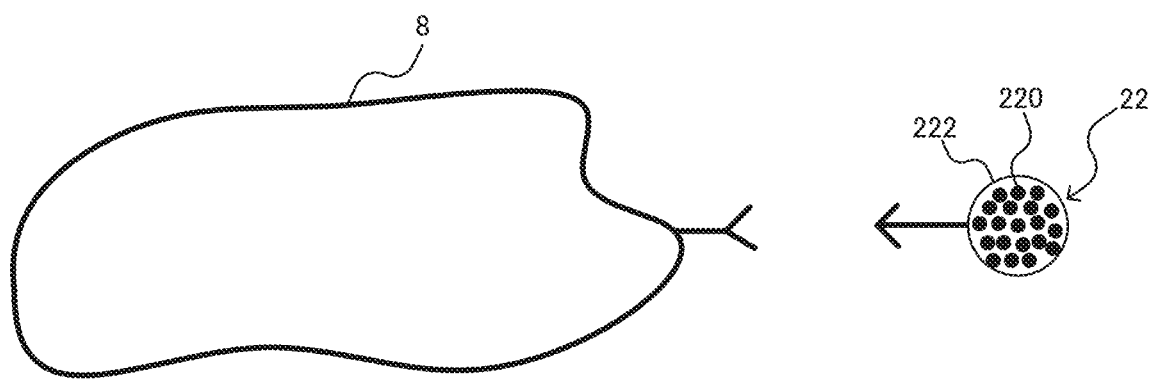
FIG. 13 is a diagram schematically illustrating a method of depositing magnetic particles on living moving cells.

FIG. 13 is a diagram schematically illustrating a method of depositing the magnetic particles 22 on living moving cells 8. As illustrated in FIG. 13, the magnetic particles 22 are spherical particles having a diameter of, for example, about 1 μm in which a plurality of superparamagnetic particles 220 exhibiting superparamagnetic properties are coated with a polymer 222. The magnetic particles 22 are bound to cells 8 by, for example, an antigen-antibody reaction.

Also in this case, the magnetic measuring device 1 may irradiate only the diamond plate 2 with the excitation light emitted from the light source part 4, and may prevent the cells or the magnetic particles 22 placed on the diamond plate 2 from being irradiated with the excitation light. Thus, the cells 8 can be observed over a long period of time without light damage. Also, since the magnetic measuring device 1 can measure the magnetism while updating the microwave frequency, it is possible to reduce the influence of temperature variation over time.

As described above, the magnetic measuring device 1 according to the embodiment can measure magnetism with high sensitivity even if a diamond plate is not highly pure and density and electron spin coherence time of an NV center are nonuniform.

REFERENCE SIGNS LIST

1 Magnetism measuring device
2 Diamond plate
20 Static magnetic field application part
22 Magnetic particle
220 Superparamagnetic particle
222 Polymer
3 Microwave irradiation part
30 Microwave oscillator
300 Pulse generation part
302 Microwave generation part
304 Amplification part
306 Pulse modulation signal
308 Frequency update signal
310 Sweep start signal
32 Phase shifter
320 Branch point
322 Coarse-tuning part
324 Fine-tuning part
34 Microwave coil board
340 Microwave coil
4 Light source part
40 Dichroic mirror
42 Objective lens
44 Condenser lens
5 Image sensor
6 Control part
60 Input part
62 Output part
600 CPU
602 Memory
7 Program
70 Determination part
71 Setting part
72 Frequency correction part
73 Frequency update part
8 Cell

The invention claimed is:

1. A magnetic measuring device, comprising:
a diamond plate including an NV center in a predetermined area;
a static magnetic field application part configured to apply a static magnetic field to one or more magnetic particles that are formed in an aggregate of a plurality of superparamagnetic particles that are placed on the diamond plate and exhibit superparamagnetic properties, and the diamond plate;
a microwave irradiation part configured to irradiate the diamond plate with a microwave;
a light source configured to irradiate the diamond plate with excitation light;
an image sensor configured to detect intensity of fluorescence in the predetermined area of the diamond plate by the excitation light for each pixel arrayed two-dimensionally;
a determination part configured to identify, based on a detection result of the image sensor, two positive and negative maximum inclination points from each of two relative fluorescence intensity decrease points in a pair which are generated to be symmetrical about near 2870 MHz in an average value in a visual field of an optically detected microwave resonance spectrum of the diamond plate after Zeeman splitting by the static magnetic field when an optical microwave resonance spectrum has microwave frequency dependence of relative fluorescence intensity which is a ratio of a difference in fluorescence intensity between when no microwave is irradiated and when the microwave is irradiated with respect to the fluorescence intensity when no microwave is irradiated, and configured to determine a degree of decrease in the relative fluorescence intensity and a microwave frequency at each of maximum inclination points of the respective identified four points in total;
a setting part configured to set a reference decrease degree of the relative fluorescence intensity in the predetermined area and configured to set operating point frequency initial values at the four points at which the reference decrease degree is achieved, near the microwave frequencies at the respective maximum inclination points, based on the determined relative fluorescence intensity and the microwave frequency determined for each maximum inclination point by the determination part;
a frequency update part configured to update operating frequencies at the four points so that the degree of decrease in the relative fluorescence intensity in the predetermined area in the operating point frequency at each of the four points approaches the reference decrease degree;
a frequency correction part configured to input the updated operating point frequencies as corrected operating point frequencies to a microwave oscillator;
an integration part configured to integrate the detection result of the image sensor at each of the corrected operating point frequencies for each pixel while the microwave irradiation part sequentially irradiates the predetermined area within a predetermined period of time with each of the microwaves having the operating point frequencies at the four points; and
an output part configured to output the relative fluorescence intensity in the predetermined area as an image based on a result integrated for each pixel by the integration part.

2. The magnetic measuring device according to claim 1, wherein
the image sensor is configured to perform exposure and reading for each of a period of time during which the microwave irradiation part irradiates the predetermined area with the microwave having any one of the four operating point frequencies and a period of time during which the microwave irradiation part does not irradiate the predetermined area.

3. The magnetic measuring device according to claim 2, wherein
the microwave irradiation part includes:
a micro generation part for generating a microwave;
a phase shifter for setting a phase delay of the microwave generated by the microwave generation part; and
a microwave coil for irradiating the diamond plate with a microwave in which a phase delay is set by the phase shifter.

4. The magnetic measuring device according to claim 3, wherein
the microwave coil is configured to generate a microwave magnetic field in a direction parallel to a surface of the diamond plate.

5. The magnetic measuring device according to claim 4, wherein
a thickness of an NV layer, which is a thin film including the NV center, of the diamond plate is substantially equal to a diameter of a magnetic particle.

6. The magnetic measuring device according to claim 3, wherein
a thickness of an NV layer, which is a thin film including the NV center, of the diamond plate is substantially equal to a diameter of a magnetic particle.

7. The magnetic measuring device according to claim 2, wherein
a thickness of an NV layer, which is a thin film including the NV center, of the diamond plate is substantially equal to a diameter of a magnetic particle.

8. The magnetic measuring device according to claim 1, wherein
the microwave irradiation part includes:
a micro generation part for generating a microwave;
a phase shifter for setting a phase delay of the microwave generated by the microwave generation part; and
a microwave coil for irradiating the diamond plate with a microwave in which a phase delay is set by the phase shifter.

9. The magnetic measuring device according to claim 8, wherein
the microwave coil is configured to generate a microwave magnetic field in a direction parallel to a surface of the diamond plate.

10. The magnetic measuring device according to claim 9, wherein
a thickness of an NV layer, which is a thin film including the NV center, of the diamond plate is substantially equal to a diameter of a magnetic particle.

11. The magnetic measuring device according to claim 8, wherein
a thickness of an NV layer, which is a thin film including the NV center, of the diamond plate is substantially equal to a diameter of a magnetic particle.

12. The magnetic measuring device according to claim 1, wherein
a thickness of an NV layer, which is a thin film including the NV center, of the diamond plate is substantially equal to a diameter of a magnetic particle.

13. The magnetic measuring device according to claim 1, comprising:
a storage part for storing each of results integrated by the integration part at a predetermined time interval for each pixel,
wherein the output part is configured to correct, based on the results stored in the storage part, a distribution for each pixel of the relative fluorescence intensity in the predetermined area every time interval according to a minimum value of a decrease point of the relative fluorescence intensity measured for each pixel in advance, and outputs as an image.

14. A magnetic measuring device, comprising:
a diamond plate including an NV center in a predetermined area;
a static magnetic field application part configured to apply a static magnetic field to the diamond plate;
a microwave irradiation part configured to irradiate the diamond plate with a microwave;
a light source configured to irradiate the diamond plate with excitation light; and
a fluorescence detector configured to detect intensity of fluorescence in the predetermined area of the diamond plate by the excitation light,
wherein when a ratio of a fluorescence intensity difference between when the microwave is irradiated and when no microwave is irradiated or when the microwave having a frequency having no influence on the fluorescence intensity with respect to the fluorescence intensity when no microwave is irradiated or when the microwave having a frequency having no influence on the fluorescence intensity is referred to as relative fluorescence intensity,
two relative fluorescence intensity decrease areas in a pair are selected, the relative fluorescence intensity decrease areas being generated to be symmetrical about near 2870 MHz of the microwave frequency by the static magnetic field,
when each of the decrease areas is further divided into a lower frequency side and a higher frequency side than a minimum value of the decrease area,
in four frequency regions in total
on the lower frequency side and the higher frequency side of a first relative fluorescence intensity decrease area, and on the lower frequency side and the higher frequency side of a second relative fluorescence intensity decrease area,
a change in the relative fluorescence intensity is considerably larger than a change in the frequency, and
a reference decrease degree of the relative fluorescence intensity commonly included in the four frequency regions is set,
while sequentially and cyclically irradiating the four frequency regions with four microwave frequencies in total, respectively,
the relative fluorescence intensity at each frequency is detected by the fluorescence detector,
whereby an integration result of the relative fluorescence intensity at each microwave frequency and a difference in the reference decrease degree are reflected, and
the microwave frequency is adjusted in each frequency region,
whereby the relative fluorescence intensity is set as a linear operation value among the four microwave frequencies converged to the reference decrease degree, and
a magnetic field or a temperature in the predetermined area of the diamond plate is measured,
whereby noise having cycle longer than the cycle is eliminated.

15. The magnetic measuring device according to claim 14, wherein
the microwave irradiation part includes:
a micro generation part for generating a microwave;
a phase shifter for setting a phase delay of the microwave generated by the microwave generation part; and a microwave coil for irradiating the diamond plate with a microwave in which a phase delay is set by the phase shifter.

16. The magnetic measuring device according to claim 15, wherein
the microwave coil is configured to generate a microwave magnetic field in a direction parallel to a surface of the diamond plate.

17. The magnetic measuring device according to claim 16, wherein
a thickness of an NV layer, which is a thin film including the NV center, of the diamond plate is substantially equal to a diameter of a magnetic particle.

18. The magnetic measuring device according to claim 15, wherein
a thickness of an NV layer, which is a thin film including the NV center, of the diamond plate is substantially equal to a diameter of a magnetic particle.

19. The magnetic measuring device according to claim 14, wherein
a thickness of an NV layer, which is a thin film including the NV center, of the diamond plate is substantially equal to a diameter of a magnetic particle.

* * * * *